United States Patent [19]

Basiulis

[11] 4,011,104
[45] Mar. 8, 1977

[54] THERMOELECTRIC SYSTEM

[75] Inventor: Algerd Basiulis, Redondo Beach, Calif.

[73] Assignee: Hughes Aircraft Company, Culver City, Calif.

[22] Filed: Oct. 5, 1973

[21] Appl. No.: 403,726

[52] U.S. Cl. ............................ 136/205; 165/105; 62/3
[51] Int. Cl.² ..................................... H01L 35/30
[58] Field of Search .......... 136/202, 205, 212, 224, 136/225; 62/3; 165/105

[56] References Cited
UNITED STATES PATENTS

| 2,986,009 | 5/1961 | Gaysowski | 62/3 |
|---|---|---|---|
| 3,437,847 | 4/1969 | Raspet | 136/202 |
| 3,524,772 | 8/1970 | Purdy | 136/205 |
| 3,666,566 | 5/1972 | Paine | 136/202 |
| 3,762,011 | 10/1973 | Standhammer | 165/105 |
| 3,801,446 | 4/1974 | Sparber | 136/202 |
| 3,812,905 | 5/1974 | Hamerdinger | 165/105 |

Primary Examiner—Verlin R. Pendegrass
Attorney, Agent, or Firm—John Holtrichter, Jr.; W. H. MacAllister

[57] ABSTRACT

A system wherein a plurality of thermoelectric modules are thermally connected by heat pipes forming a cascaded structure that is capable of operating effectively and reliably with large temperature gradients, the heat pipes providing relatively low temperature gradient interfaces between the thermoelectric modules and thereby act as stress isolation structures.

1 Claim, 8 Drawing Figures

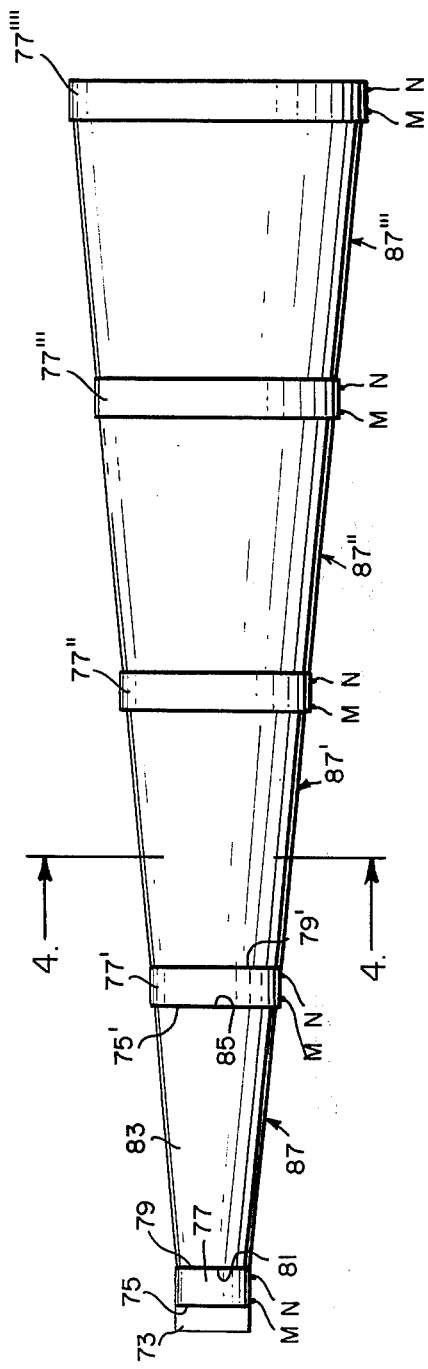
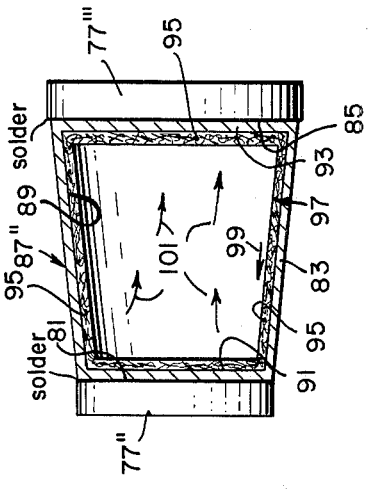
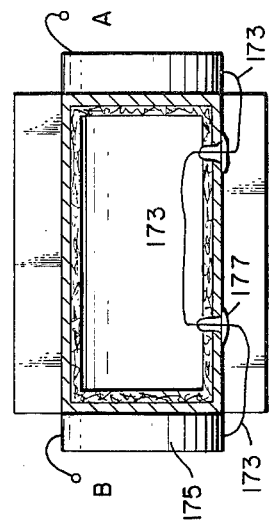
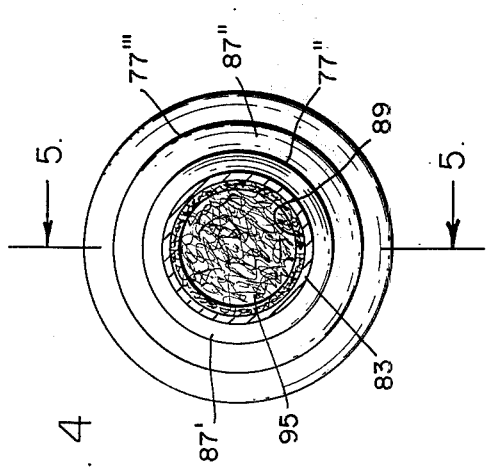

THERMOELECTRIC SYSTEM

BACKGROUND OF THE INVENTION

The background of the invention will be set forth in two parts.

1. Field of the Invention

This invention relates to thermoelectric devices and more particularly to stacked or staged thermoelectric modules capable of operation with large temperature gradients.

2. Description of the Prior Art

Devices capable of heating, cooling and power generation using thermoelectric principles and particularly the Peltier effect are well known in the art. These devices are generally referred to as thermoelectric coolers or generators and usually consist of thermoelectric couples connected in series and grouped into a device called a thermoelectric module. A more detailed description of thermoelectric modules may be had by making reference to many available publications on the subject such as, for example "Semiconductor Thermoelements and Thermoelectric Cooling" by A. F. Ioffe, published by Inforsearch Limited, London, 1957; and "Thermoelectric Materials and Devices," by I. B. Cadoff and E. Miller, Reinhold Publishing Corporation, New York 1960.

A thermoelectric module is capable of providing about 40° C difference between its two opposite parallel planar surfaces, which difference is generally referred to as a temperature gradient for ΔT for the device. Where greater temperature gradients are required, these modules are stacked one on the other to a maximum, with reliability, of usually only a three stage unit. Typically, this staged arrangement could obtain ΔT's of from 50° to 70° C. In order to obtain greater temperature gradients, more stages are needed, However, these devices have very low expansion coefficients and are very brittle. It has been found that when exposed to high temperature gradients, these units will generally crack or strain solder joints which electrically bond the thermoelectric couples to their associated thermoelectric conducting bus bars. This has been the primary limitation on thermoelectric devices, and as a result, high temperature gradients have not been reliably obtainable in conventional thermoelectric coolers. It should therefore be evident that a thermoelectric system that provides a greater temperature gradient without the danger of damaging the thermoelectric modules would consititute a significant advancement of the art.

SUMMARY OF THE INVENTION

In view of the foregoing factors and conditions characteristic of the prior art, it is a primary object of the present invention to provide an improved thermoelectric system capable of operating with relatively high temperature gradients of up to 150° C and greater.

Is is another object of the present invention to provide a relatively simple yet reliable thermoelectric system incorporating heat pipes between staged thermoelectric modules which act as stress isolation elements to prevent straining of solder joints or cracking of the semiconducting materials used in the fabrication of the modules. It is still another object of the present invention to provide a thermoelectric system wherein heat generated by a device to be cooled, and by the thermoelectric modules incorporated in the invention structure, is at least partially radiated from fins extending from the outer surface of heat pipes disposed between and thermally coupled to the thermoelectric modules.

It is yet another object of the present invention to provide a thermoelectric system wherein electrical conductors carrying current for the serially connected modules of the system are at least partially disposed within the heat pipes separating the modules. It is still a further object of the prsent invention to provide a thermoelectric system wherein heat pipes of electrically insulating material are disposed between and thermally coupled to adjacent thermoelectric modules in order to obviate the necessity of electrical insulation layers being disposed at the interfaces.

In accordance with an embodiment of the present invention, a thermoelectric system for use in relatively high temperature gradient applications includes a plurality of thermoelectric modules each including a grouping of themoelectric couples electrically interconnected to cool a first of the modules' two parallel planar surfaces and to dissipate heat from a second planar surface of the module. The first planar surface of each module is disposed adjacent the second planar surface of adjacent module to provide a serial thermal relationship of the modules. Also included is a separate heat pipe disposed between and thermally coupled to each adjacent pair of the thermoelectric modules, the heat pipes including a sealed tubular housing having a closed evaporator end and an opposite closed end. Disposed within the housing is a volatile working fluid and capillary flow means for conveying the working fluid liquid toward the evaporator end thereof, the evaporator end being juxtaposed the second planar surface of the thermoelectric modules.

Successive ones of the thermoelectric modules may have greater planar surface areas and the heat pipes therebetween may be in the form of closed conical sections having planar end surfaces approximately corresponding in area to that of the module ends attached thereto.

Alternately, the heat pipes may include heat radiating means such as fins, for example, and closed heat pipe housings may be cylindrical in form with a constant cross sectional area along their length.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings in which like reference characters refer to like elements in the several views.

BRIEF DESCRIPTION OF THE DRAWINGS

FIG. 3 is a side view of a thermoelectric system incorporating heat pipes disposed between adjacent thermoelectric modules in accordance with the present invention;

FIG. 4 is a sectional view taken along the line 4—4 in FIG. 3;

FIG. 5 is a view, partially in section, of one of the heat pipes in the structure illustrated in FIG. 3;

FIG. 8 is a schematic illustration of a technique for routing at least a portion of a module-interconnecting conductor through the interior of the successively disposed heat pipes.

DESCRIPTION OF THE PREFERRED EMBODIMENTS

Figure 1:
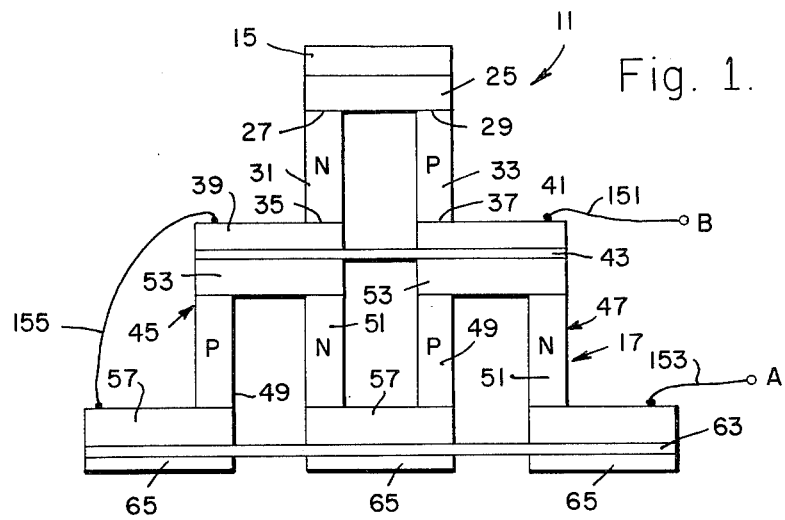
FIG. 1 is a schematic representation of a portion of a typical prior art thermoelectric system incorporating staged thermoelectric modules.
Figure 2:
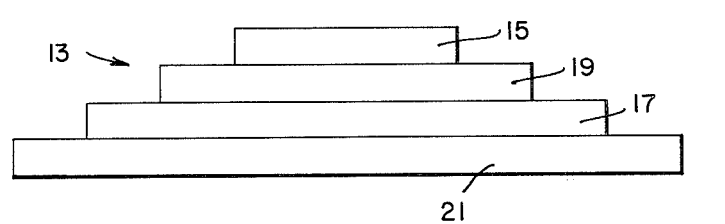
FIG. 2 is a simplified block diagram of a typical prior art thermoelectric cooling system having three stacked modules.

Referring now to the drawings and more particularly to the prior art structures of FIGS. 1 and 2, there is shown in FIG. 1 a portion 11 of a prior art 3-stage thermoelectric cooler 13 capable of operation with a temperature gradient from about 50° to 70° C. Because each successive module must not only remove the heat generated in the device 15, but must also remove the heat generated in each of the upstream modules and that generated in itself (since they all have a relatively low coefficient of performance), it has been found that a successive increase of module capacity (which is related to area) of the order of 4 is generally required to provide a useable cooler construction. Thus, a second stage 17 has an area approximately four times greater than a first stage 19, and a third stage 21 has an area approximately four times greater than that of the second stage 17.

This factor is more clearly illustrated schematically by the two-stage portion shown in FIG. 1 where the device 15, such as an infrared detector, for example, is soldered or otherwise affixed to and supported on an electrically conducting bus bar 25 of copper, for example, that spans the ends 27 and 29 of respective oppositely-doped conventional semiconductor thermoelectric elements (TE's) 31 and 33. The opposite ends 35 and 37, respectively, of these elements are attached by solder, for example, to bus bars 39 and 41 to complete a simplified description of a single thermoelectric module, such as the first module 19 for example.

As noted previously, the ΔT for a single stage is relatively small and in many important applications of thermoelectric systems a much greater ΔT is required. In accordance with the prior art, modules are simply stacked on each other and only separated (for electrical installation purposes) by a relatively thin insulation layer 43 such as, for example, a ceramic (alumina or berilia oxide) or a polyester film that conducts heat but not electrical current therethrough. The next module 17 is simply two serially connected thermoelectric junctions 45 and 47 which are similar to the singlejunction first module 19 having P and N TE's 49 and 51 soldered between upper bus bars 53 and lower bus bars 57. A thermally transmissive but electrically insulative layer 63 is also provided to insulate the module 17 from external structures such as heat dissipating plates 65 which generally register and conform in size, shape and expansion coefficients with the bus bars 57, to reduce thermal stresses.

Although it would seem a simple expedient to stack as many thermoelectric modules having limited ΔT's as needed to provide an overall relatively larger ΔT for the system, this cannot be done. The problem is that these modules have very low expansion of coefficient characteristics and are very brittle. When exposed to high temperature gradients they tend to crack or strain solder joints and become inoperative. This is what is known in the art as the "bimetal effect" and has been the primary limitation on prior art thermoelectric devices. As a result, high temperature gradients have not been obtainable in conventional thermoelectric systems. For a more detailed description of the theory and construction of conventional thermoelectric systems, reference may be made to publications such as, for example, "Applications of Thermoelectricity" by H. J. Goldsmid, published by John Wiley & Sons, Inc., New York 1960.

In accordance with the present invention, an extremely advantageous and novel technique has been employed in order to thermally couple, while stress isolating, each of the thermoelectric modules of a staged system to allow a much greater overall temperature gradient to be dealt with. FIG. 3 illustrates one embodiment 71 of the present invention wherein a device to be cooled, herein referred to by reference character 73, is attached to a first planar surface 75 of a conventional single-stage thermoelectric module 77. Where it is desired that the device 73 be electrically insulated from the system structure 71, a conventional thin insulative layer similar to layers 43 and 63, for example, may be interposed between the device 73 and the surface 75. However, for the sake of simplicity, this layer is not illustrated in FIG. 3.

A opposite planar surface 79 of the module 77 is in turn attached by any conventional means such as soldering, for example, to a closed evaporator end 81 of a sealed tubular housing 83, which with its opposite closed end 85, defines a first heat pipe element 87. In that FIG. 3 is not drawn to scale, it should be pointed out that in this embodiment, the area of the first heat pipe's closed end 85 is approximately for times the area of its evaporator end 81 and is attached by conventional means such as solder to a first planar surface 75' of a second single-stage thermoelectric module 77'. Of course, the area of the planar surface 75' is approximately equal to that of the mated surface 85 of the first heat pipe 87, and the heat capacity of the second stage is approximately four times that of the first module 77. Similarly, as many successive thermoelectric module stages 77 may be added to obtain a desired total temperature gradient, each being stress-isolated from the others by an appropriately dimensioned heat pipe element 87.

As can best be seen in FIGS. 4 and 5, the heat pipe elements 87 include sealed tubular housings 83 generally in the form of hollow conical sections having an interior side wall 89 and first and second end walls 91 and 93, respectively. Sealed by conventional means within each of the heat pipe elements 87 is a volatile working fluid 95 and capillary flow means 97. The type of working fluid used generally depends on the operating temperature to be encountered. For example, liquid metals such as sodium and mercury and other liquids such as water, ammonia or methyl alcohol, and gases such as nitrogen may be used as a working fluid. Of course, consideration must be given to the reaction of the working fluid with the material utilized to fabricate the housing 83.

The capillary flow means 97 may also take one of many forms known in the art. Preferably, a porous wick arrangement is utilized which conveys the working fluid in its liquid state toward the evaporator end 81, as indicated by arrow 99 in FIG. 5. Upon reaching this relatively hotter end of the housing 87, the fluid 95 evaporates and its vapor moves generally in the direction shown by arrows 101 toward the opposite end 85 of the housing where it condenses back to its liquid state and flows by capillary action toward the condenser end 81.

Where the housing 87 is stainless steel, the porous wick arrangement may be one or more layers of woven stainless steel screen, or it may comprise stainless steel fibers that are sintered together to form a felt-like mass. On the other hand, where a copper housing is used, porous copper powder may be deposited on the housing's inner surface 89, or layers of copper mesh may be utilized, for example. In that heat pipes generally are well known in the art, no detailed description of their theory of operation is provided herein. However, it may generally be stated that heat, which is transferred to the heat pipe from any source, vaporizes the working fluid in the evaporator region of the heat pipe. This vapor moves to a cooler section (condenser region) where the vapor gives up thermal energy as heat of condensation. The condensed working fluid then returns to the evaporator section by means of the capillary action of the wick. The heat pipe thus employs a boiling-condensing cycle with the capillary wick pumping the condensate to the evaporator. The vapor pressure drop between the evaporator and the condenser is very small and therefore the boiling-condensing cycle is essentially an isothermal process. The temperature losses between the heat source and the vapor and between the vapor and the heat sink can be made small by proper design. As a result, one feature of the heat pipe is that it can be designed to transport heat between the heat source and the heat sink with very small temperature losses.

The amount of heat that can be transported as latent heat of vaporization is usually several orders of magnitude larger than can be transported as sensible heat in a conventional convective system with an equivalent temperature difference. A second feature of the heat pipe is that relatively large amounts of heat can be transported with small, lightweight structures. It is important to note that heat pipes can be made in many sizes and shapes . . . round, flat, square, rectangular, irregular . . . even flexible. Generally speaking, heat pipes are completely self-contained, have no moving parts, require no external power, and are capable of transferring thermal power with little temperature gradient over their entire working length. Any of the host of technical articles may be consulted on the subject of heat pipes. Examples of such articles are "The Heat Pipe" by G. Yale Eastman in "Scientific American," May 1968, pp. 38–46; "The Heat Pipe" by K. Thomas Feldman, Jr. and Glen H. Whiting in "Mechanical Engineering," Feb. 1967, pp. 30–33; a paper entitled "Heat Pipe Design Considerations" by Joseph E. Kemme given at the 11th Heat Transfer Conference, Aug. 3–6, 1969, Minneapolis, Minnesota, and distributed by the Los Alamos Scientific Laboratory of the University of California, Los Alamos, New Mexico, Aug. 1, 1967, to name but a few.

The action of the heat pipes 87 by nature of their typical characteristics, provides a low temperature gradient between its opposite ends. Thus when such heat pipes are connected between the thermoelectric stages of the system, they provide stress isolation between these stages and thereby prevent the straining of the solder joints and the cracking of the semi-conducting materials of the thermoelectric module 77. Accordingly, by utilizing the inventive technique herein described, a cryogenic thermoelectric cooler operating with a $\Delta T$ of about 150° C may be constructed and successfully and reliably operated.

Figure 7:
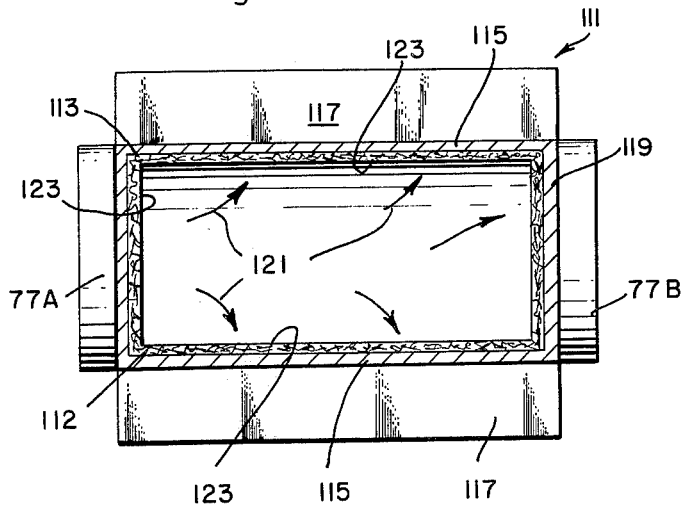
FIG. 7 is a sectional view of the heat pipe of FIG. 6 taken along the line 7—7.
Figure 6:
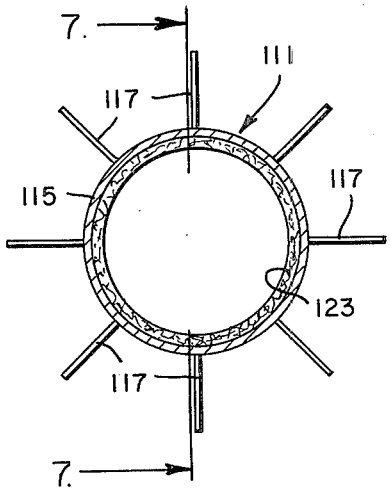
FIG. 6 is a sectional view of a heat pipe in accordance with another embodiment of the present invention.

In applications where the exterior walls of the heat pipes are exposed to a cooling medium, a finned heat pipe structure 111, as illustrated in FIGS. 6 and 7, may be employed. Here, working fluid 112 evaporated at an evaporator end 113 will move away from the end 113 and generally toward the cooler side wall 115 of the structure 111, the exterior wall surface of which is provided with radially extending fins 117 attached to the structure 114 by any suitable conventional fabricating process. Upon encountering the side wall 115 and also possibly the opposite end wall 119, as indicated by arrows 121, the working fluid will condense back to its liquid state and be conveyed through capillary action by a capillary flow means 123 that is similar to the flow means 97 in the previously described embodiment of the invention.

It will be noted that where, as in this embodiment, the heat incident at the evaporator end 113 is at least partially radiated out of the system and not totally conveyed from an upstream thermoelectric module 77A to a downstream module 77B, the latter module need not have the capacity to handle additional parasitic heat generated in each successive thermoelectric module. Thus, all the modules may be designed to handle an equal quantity of heat energy and may all have the same cross-sectional area. This allows the heat pipe structure 111 to be cylindrical and not conical in form.

All the thermoelectric elements in the above-described thermoelectric modules are generally electrically connected in series in a manner similar to the illustrated in FIG. 1, where a source of electrical current (not shown) is connected to terminals A and B of input leads 151 and 153, the bus bar 53 of the first stage 19 being connected to the bus bar 57 of the second stage 17 by conductor 155. Thus, each thermoelectric module 77 will have two terminals M and N which may be connected in series by external conductors, not shown, in a manner known to those skilled in the art so that an aiding serial thermal relationship exists between the successive modules.

Alternatively, the conductive thermal path provided by these external module-interconnection conductors may be eliminated by routing at least a portion of these electrical conductors within heat pipes, as illustrated by way of example in FIG. 8; thus in FIG. 8, a conductor 173 is connected at one end to an upstream sealed thermoelectric module 175 and passes through a suitable sealed feedthrough insulator 177 to the interior 179 of the heat pipe 181. The conductor exits the pipe through another insulator 183 and is connected to a downstream module 185, leads 187 and 189 being respectively provided to conduct electrical current applied to terminals A and B from a conventional source, not shown. This technique effectively eliminates the disadvantageous thermal conductive path otherwise provided by an externally routed electrical conductor.

From the foregoing, it should be evident that there has herein been described an improved thermoelectric system wherein a plurality of thermoelectric modules are thermally connected by heat pipes forming a cascaded structure that is capable of operating effectively and reliably with large temperature gradients.

It should be understood that the materials used to fabricate the various embodiments of the invention are not critical, and any material exhibiting similar desired characteristics may be substituted for those mentioned.

For example, the heat pipe housings may be constructed from electrically-insulative ceramic materials which would eliminate the need of the thin insulation layers disposed between the conductive portion of the thermoelectric modules and the heat pipes.

Accordingly, it should be realized that the invention is not limited to any particular application and, although the present invention has been shown and described with reference to particular embodiments, various changes and modifications obvious to one skilled in the art to which the invention pertains are deemed to be within the spirit, scope, and contemplation of the invention.

What is claimed is:

1. A thermoelectric system for use in relatively high temperature gradient applications, comprising:

a plurality of thermoelectric modules, said modules including a grouping of thermoelectric couples electrically interconnected to cool a first of the modules' two parallel planar surfaces and the dissipate heat from a second planar surface of said module, said first planar surface of each of said modules being adjacent said second planar surface of adjacent modules to provide a serial thermal relationship of said modules; and a separate heat pipe disposed between and thermally coupled to each adjacent pair of said thermoelectric modules, said heat pipe including a sealed tubular housing having a closed evaporator end and an opposite closed end, a volatile working fluid and capilary flow means being disposed within said housing for conveying said working fluid liquid toward said evaporator end thereof, said evaporator end being juxtaposed said second planar surface of said thermoelectric modules, and said thermoelectric modules being electrically interconnected by electrical conductors at least a portion of which are disposed within said sealed tubular housing.